United States Patent
Gautama

(10) Patent No.: US 9,917,554 B2
(45) Date of Patent: Mar. 13, 2018

(54) CONTROL OF A LOUDSPEAKER OUTPUT

(75) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 334 days.

(21) Appl. No.: 13/489,754

(22) Filed: Jun. 6, 2012

(65) Prior Publication Data

US 2012/0328117 A1 Dec. 27, 2012

(30) Foreign Application Priority Data

Jun. 22, 2011 (EP) .................................... 11170863

(51) Int. Cl.
| | |
|---|---|
| *H04R 29/00* | (2006.01) |
| *H03F 1/52* | (2006.01) |
| *H03F 3/181* | (2006.01) |
| *H03G 7/00* | (2006.01) |
| *H03G 9/02* | (2006.01) |
| *H04R 3/00* | (2006.01) |
| *H03G 11/00* | (2006.01) |

(52) U.S. Cl.
CPC ............... *H03F 1/52* (2013.01); *H03F 3/181* (2013.01); *H03G 7/002* (2013.01); *H03G 9/025* (2013.01); *H04R 3/007* (2013.01); *H04R 29/003* (2013.01); *H03F 2200/03* (2013.01); *H03F 2200/447* (2013.01)

(58) Field of Classification Search
CPC ........ H03G 9/025; H03G 11/00; H03G 7/002; H04R 3/00; H04R 25/356; H04R 3/007; H04R 29/003; H03F 1/52; H03F 3/181; H03F 2200/03; H03F 2200/447
USPC ................................ 381/59, 104, 107, 55, 58
See application file for complete search history.

(56) References Cited

U.S. PATENT DOCUMENTS

| | | | |
|---|---|---|---|
| 6,940,981 | B2 | 9/2005 | Neunaber |
| 8,494,182 | B2 | 7/2013 | Spielbauer |
| 2002/0125945 | A1 | 9/2002 | Taylor |
| 2003/0059034 | A1* | 3/2003 | Etter ........................ H03G 7/06 379/392.01 |
| 2004/0178852 | A1* | 9/2004 | Neunaber ................. H03F 1/52 330/284 |
| 2004/0184627 | A1* | 9/2004 | Kost ........................ H03F 1/523 381/120 |

(Continued)

FOREIGN PATENT DOCUMENTS

CN 101388652 A 3/2009

OTHER PUBLICATIONS

Behler, G. et al. "Measuring the Loudspeaker's Impedance During Operation for the Evaluation of the Voice Coil Temperature", Proc. of the 98th AES Convention, paper No. 4001, 14 pgs. (Feb. 1995).

(Continued)

*Primary Examiner* — Vivian Chin
*Assistant Examiner* — Ammar Hamid
(74) *Attorney, Agent, or Firm* — Rajeev Madnawat

(57) ABSTRACT

A loudspeaker drive circuit uses a dynamic range compressor to implement a non-linear gain function between the input signal to the dynamic range compressor and an output signal from the dynamic range compressor. The output is used to drive a loudspeaker, and the operating parameters of the dynamic range compressor are varied in dependence on a criterion, such as the estimated voice coil temperature, the power consumption or the acoustical distortion.

14 Claims, 3 Drawing Sheets

(56) References Cited

U.S. PATENT DOCUMENTS

2012/0278087 A1* 11/2012 Hosokawa ............ H03G 9/025
704/500

OTHER PUBLICATIONS

Chapman, P. J. "Thermal Simulation of Loudspeakers", Proc. of the 104th AES Convention, paper No. 4667, 31 pgs. (May 1998).
Chapman, P. J. "Complete Thermal Protection of an Active Loudspeaker", Proc. of the 108th AES Convention, paper No. 5112, 22 pgs. (Feb. 2000).
Bortoni, C. et al. "Real-Time Voice-Coil Temperature and Cone Displacement Control of Loudspeakers", Proc. of the 117th AES Convention, paper No. 6249, 8 pgs. (Oct. 2004).
Klippel, W. "Nonlinear Modeling of the Heat Transfer in Loudspeakers", J. of the Audio Engineering Society, vol. 52, No. 1/2, pgs. 3-25 (2004).
Extended European Search Report for European Patent Appln. No. 11170863.2 (Sep. 22, 2011).

* cited by examiner

CONTROL OF A LOUDSPEAKER OUTPUT

CROSS-REFERENCE TO RELATED APPLICATIONS

This application claims the priority under 35 U.S.C. § 119 of European patent application no. 11170863.2, filed on Jun. 22, 2011, the contents of which are incorporated by reference herein.

This invention relates to the control of the output of a loudspeaker.

Loudspeakers are devices to convert electrical energy into acoustical energy.

However, much of the electrical power that is applied to the loudspeaker results in heat dissipation, which causes many of the common loudspeaker defects. To prevent thermal damage (permanent or transitory), it is desirable to measure the voice coil temperature of the loudspeaker, and to condition the input in such a way that this temperature does not exceed a certain limit.

One way to estimate the voice coil temperature is to predict its value from the electrical signal that is sent to the loudspeaker using a mathematical model of the loudspeaker using a number of pre-estimated parameters, see e.g. Klippel, W., 2004. "Nonlinear Modeling of the Heat Transfer in Loudspeakers" in: Audio Eng. Soc. 52, 3-25.

A different approach is to measure the current and voltage in the voice coil directly using a tone at an evaluation frequency, and estimate its temperature based on those measurements. This approach is taken in Behler, Gottfried; Spätling, U.; Arimont, T. "Measuring the Loudspeaker's Impedance During Operation for the Evaluation of the Voice Coil Temperature" in: Proceedings of the 98th AES Convention, 5 Paris. Paper number 4001.

From the measured voltage and current the DC resistance of the loudspeaker, also referred to as Re, is determined. The DC resistance is estimated as the average of the real part of the impedance for frequencies in the vicinity of the minimum impedance exceeding the resonant frequency of the loudspeaker. Since the DC resistance depends on the temperature of the voice coil, one may determine the temperature from the DC resistance.

Also, U.S. Pat. No. 6,490,981 takes this approach. The patent discloses a method of limiting the power applied to a loudspeaker. In the method, both the voltage and current applied to the loudspeaker are measured and instantaneous power is directly calculated and used to control the level of the input signal that drives the amplifier powering the loudspeaker. When the power applied to the loudspeaker exceeds a prescribed threshold, the input level to the power amplifier is reduced until the measured power falls below the threshold. Also disclosed is a method for indirectly determining the voice coil temperature from the loudspeaker's voltage and current and reducing power to the loudspeaker when the temperature exceeds a prescribed threshold.

Thus, the current methods that are used for voice coil temperature control apply an attenuation to the source signal. For example, a gain factor can be applied with an inverse characteristic similar to the voice coil temperature variation in time. A more complex gain control scheme can be used where the signal is split into different frequency bands, and separate gain factors are used for the different frequency bands.

A control mechanism for the voice coil temperature that is based on an adaptive gain may introduce unpleasant audio artifacts, such as pumping. Furthermore, the complete signal (or frequency band in the case of a multi-band approach) is influenced by the gain control, even the lower-amplitude segments that do not cause thermal heating of the voice coil.

US 2004/0178852 discloses a method of limiting power applied to a loudspeaker using an attenuator, in response to a determined increase in voice coil temperature or measured output power.

According to the invention, there is provided a loudspeaker drive circuit as claimed in claim 1.

The invention provides a loudspeaker drive circuit comprising:

a dynamic range compressor for implementing a non-linear gain function between the input signal to the dynamic range compressor and an output signal from the dynamic range compressor, the dynamic range compressor function having a first gain portion below an input threshold level (20) and a second gain portion above the input threshold level;

a loudspeaker driver for driving a loudspeaker based on the output of the dynamic range compressor; and a control unit for controlling operating parameters of the dynamic range compressor in dependence on a control signal which represents an estimated voice coil temperature, a power consumption or an acoustical distortion level, and in a way which only influences the gain function for high amplitude or high-power input signals, wherein the operating parameter of the dynamic range compressor which is controlled is the input threshold level or the slope of the second gain portion.

The loudspeaker drive circuit further may comprise a temperature estimation unit for estimating a voice coil temperature of the loudspeaker, in which case the operating parameters of the DRC are controlled in dependence on the estimated voice coil temperature.

The loudspeaker drive circuit further may comprise a module for estimating other criteria, such as power consumption and acoustical distortion measures, in which case the operating parameters of the DRC are controlled in dependence on these criteria to preserve battery or, respectively avoid signal distortion.

The invention provides a circuit that adapts the parameters of a dynamic range compression (DRC) module to control the loudspeaker, for example to prevent thermal damage, reduce power consumption or reduce signal distortion of the loudspeaker. This way, a less intrusive effect is perceived by the user when the control mechanism is used, compared to when a gain-based method is used. The DRC influences only the high-amplitude peaks of the signal, and keeps the low-amplitude parts of the signal intact. By "high amplitude signals" is for example meant input signals higher than 40% of the designed maximum input signal, either measured in amplitude or in power. In other words, the small signal gain function is not altered, but the large signal gain function is altered, as a compression or limiting function.

The dynamic range compressor implements a gain function having a first gain portion below an input threshold level and a second gain portion above the input threshold level. Thus, there is a step in the gain function. The gain function below the threshold can be linear (i.e. a constant gain value between input and output) and the gain function can be linear above the threshold (i.e. a constant slope of the gain from the threshold point). The transition between the regions can be a hard knee (i.e. an abrupt change in slope) or a soft knee (i.e. a gradual change in slope). However, the gain functions can be more complex. In all cases, the dynamic nature is such that the resulting gain for a given maximum input signal is different from that for a small signal, so that the dynamic range at the output is altered. The parameters of the dynamic range compressor can be varied, leading to a variation of the dynamic range at the output.

This variation can be implemented in various ways.

In one example, the operating parameter of the dynamic range compressor which is controlled is the input threshold level. The threshold level can be decreased in response to an increase in estimated temperature (for example), so that the compression (i.e. attenuation) starts earlier along the input signal axis (either amplitude or power).

The dynamic range compressor can function as a limiter, with the output substantially constant when the input is above the threshold.

In another example, the operating parameter of the dynamic range compressor which is controlled is the slope of the second gain portion. For example, the second gain slope can be decreased in response to an increase in estimated temperature (for example). This means the compression (i.e. attenuation) will be greater for the maximum input signal.

The invention also provides a loudspeaker system comprising a circuit of the invention and a loudspeaker. A portable device can use the loudspeaker system.

The invention also provides a method as defined in the independent method claim.

This aspect provides a method of processing an audio input signal to derive a loudspeaker drive signal, comprising:

using a dynamic range compressor to implement a non-linear gain function between the input signal to the dynamic range compressor and an output signal from the dynamic range compressor, the dynamic range compressor function having a first gain portion below an input threshold level and a second gain portion above the input threshold level;

driving a loudspeaker based on the output of the dynamic range compressor;

controlling operating parameters of the dynamic range compressor in dependence on a control signal and in a way which only influences the gain function for high amplitude input signals, and wherein the controlling comprises:

decreasing the threshold level in response to an increase in estimated temperature, power consumption or acoustical distortion, or decreasing the slope of the second gain portion in response to an increase in estimated temperature, power consumption or acoustical distortion.

The method can be implemented in computer software.

Examples of the invention will now be described in detail with reference to the accompanying drawings, in which.

The invention provides a loudspeaker drive circuit in which a dynamic range compressor implements a non-linear gain function between the input signal to the dynamic range compressor and an output signal from the dynamic range compressor. The output is used to drive a loudspeaker, and the operating parameters of the dynamic range compressor are varied in dependence on a feedback criterion.

Figure 1:
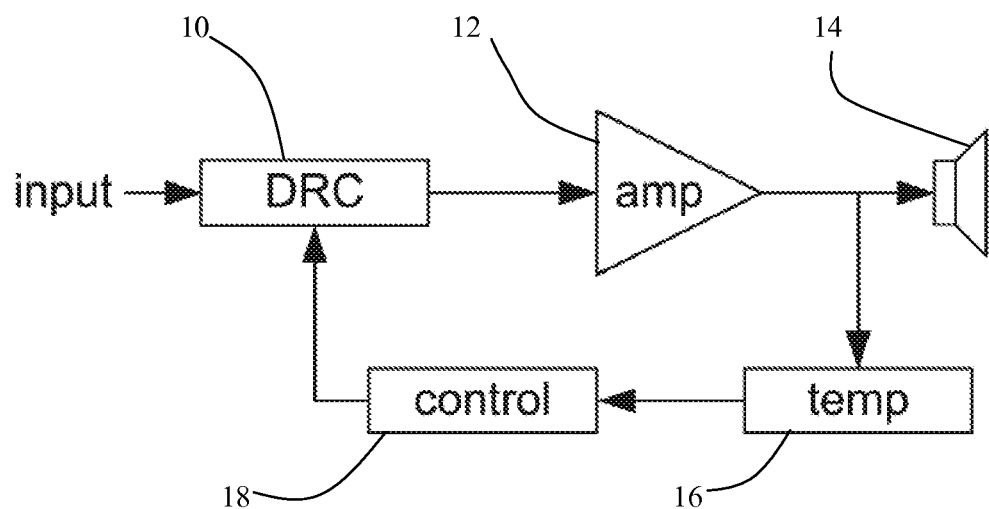
FIG. 1 shows a loudspeaker system of the invention.

The basic implementation of the proposed invention is shown in FIG. 1. As an example, the description uses the voice coil temperature, but this may also be the power consumption or a measure for the acoustical distortion.

The input signal is processed by a dynamic range compression (DRC) module 10, the output of which is amplified by amplifier 12 and sent to a loudspeaker 14. The amplifier implements the function of a loudspeaker driver. The temperature of the loudspeaker voice coil is estimated by temperature estimation unit 16, e.g. from the voltage across and current flowing into the voice coil, and the estimated temperature is used in a control module 18 to adapt the parameter(s) of the DRC if necessary. The objective of the control mechanism is to adapt the DRC parameter(s) in such a way that the loudspeaker voice coil temperature does not exceed a certain limit.

A dynamic range compression module is aimed at reducing the dynamic range of audio signals, i.e., it decreases the difference between high and low amplitude levels or volumes by attenuating or clipping larger amplitude signals.

Figure 2:
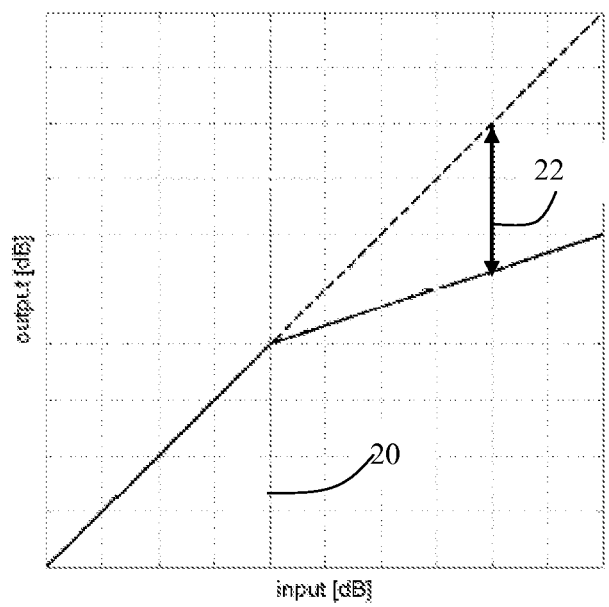
FIG. 2 shows an example of gain function of a dynamic range compressor which can be used in the system of FIG. 1.

The type of dynamic range compression is partly characterised by the compression curve, an example of which is shown in FIG. 2.

The compressor has a gain function having a first portion below an input threshold level 20 and a second portion above the input threshold level. Thus, there is a step in the gain function. The gain function below the threshold is linear and extends through the origin and the gain function is linear above the threshold (i.e. a constant slope) but the slope is smaller, so that the maximum output is decreased (compressed) compared to the extrapolation of the first function. The gain reduction is shown as 22.

The gain (as characterised by the slope of the curve) is reduced by a certain amount if the input signal level (power or amplitude) exceeds the compression threshold 20. The signal level can be computed as an asymmetrically smoothed version of the signal power or amplitude, which has an 'attack' time constant (used when the signal level increases) and a 'release' time constant (used when the signal level decreases).

The gain reduction is computed from the compression curve and is traditionally expressed as a compression ratio (e.g. a compression ratio of 3:1 means that if the input signal level exceeds the compression threshold by 3 dB, the output signal level will exceed it by 1 dB).

A special case of a DRC is a limiter, which limits the signal level to a certain value. It can be obtained by setting the compression ratio to a high value, e.g. to 50, so that the slope is almost zero.

The invention adapts one or more parameters of the dynamic range compression module in such a way that the voice coil temperature does not exceed a certain temperature threshold. The temperature is then used as a feedback parameter. This is necessary to avoid thermal damage to the loudspeaker.

The processing carried out by the DRC is controlled by its parameters (such as the threshold, compression ratio etc.). The invention can readily be extended to multi-band dynamic range compression. It is for example possible to only compress the dynamic range of the higher frequency region, since these are most likely to contribute most to the heating of the voice coil.

Several examples of control schemes are outlined below.

Figure 3:
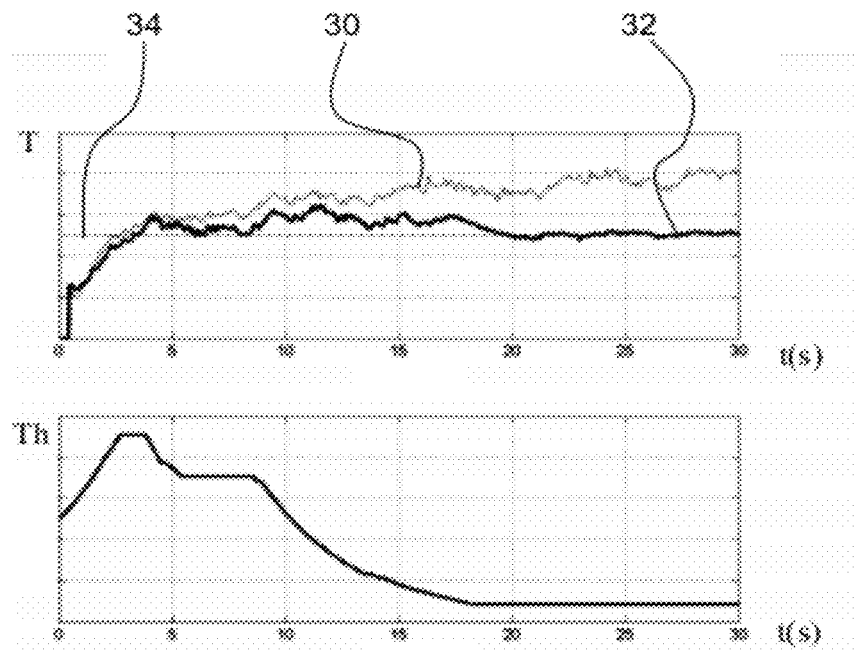
FIG. 3 shows a first possible control system implemented by the system of FIG. 1.

FIG. 3 shows a first example in which the compressor threshold is controlled by the feedback loop. In FIG. 3 (and FIGS. 4 and 5), the control mechanisms are illustrated for a 30-second ringtone signal that is played on the loudspeaker.

The upper plot shows the voice coil temperature (T—units not shown) without control (plot 30) and with control of the compressor threshold (plot 32). The bottom plot shows the compressor threshold (Th—arbitrary units) over time.

The estimated temperature is compared to the temperature threshold (line 34). If it is below the temperature threshold (with a certain margin of, say, 5 degrees Celsius), the compressor threshold is increased. If it exceeds the temperature threshold by a certain margin, of, say, 5 degrees Celsius, it is decreased in order to lower the voice coil temperature. The compressor threshold may be bounded by a lower and an upper limit.

FIG. 3 shows how the threshold is lowered over time to keep the temperature sufficiently low.

Figure 4:
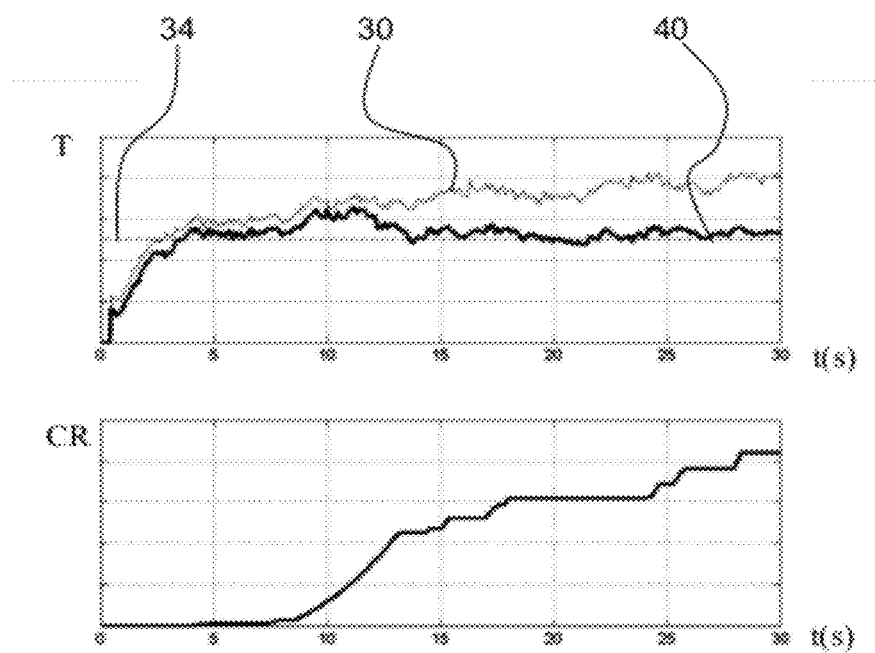
FIG. 4 shows a second possible control system implemented by the system of FIG. 1.

FIG. 4 shows a second example in which the compression ratio is controlled by the feedback loop.

The upper plot shows the same parameters as the upper plot of FIG. 3, and thus shows the voice coil temperature without control (plot 30) and with control of the compression ratio (plot 40). The bottom plot shows the compression ratio (CR—arbitrary units) over time.

As for the example of FIG. 3, the estimated temperature is compared to the temperature threshold (plot 34). If it is below the temperature threshold (with a certain margin of, say, 5 degrees Celsius), the compression ratio is decreased. If it exceeds the temperature threshold by a certain margin, of, say, 5 degrees Celsius, it is increased in order to lower the voice coil temperature. The compression ratio may be bounded by a lower and an upper limit.

FIG. 4 shows how the compression ratio is increased over time to keep the temperature sufficiently low.

Figure 5:
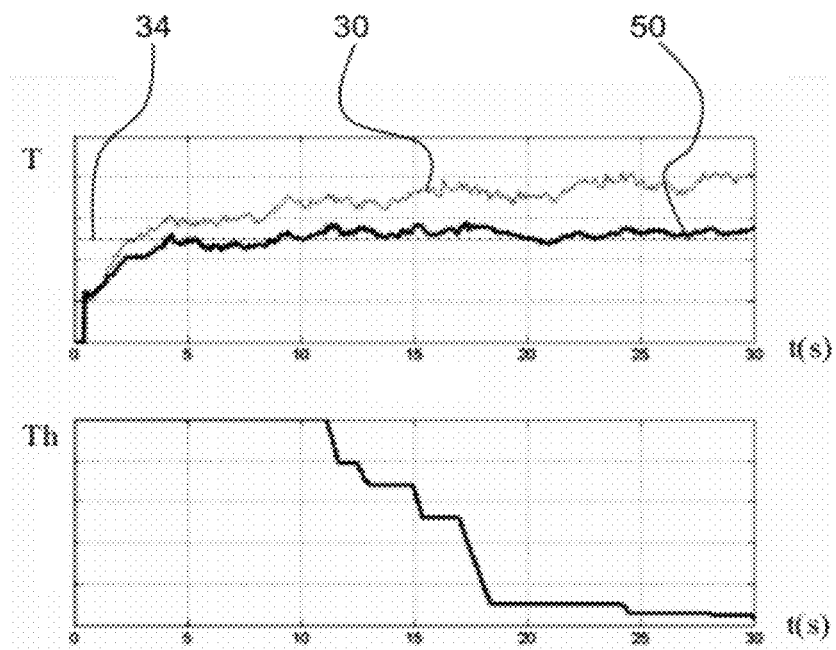
FIG. 5 shows a third possible control system implemented by the system of FIG. 1.

FIG. 5 shows a third example in which the DRC performs a limiter function, which is controlled by the feedback loop.

A DRC can function as a limiter by setting the compression ratio to a very high value. The limiter function can then be controlled by the compression threshold.

As in the examples above, the estimated temperature is compared to the temperature threshold (plot 34). If it is below the temperature threshold, the compressor threshold Th is increased. If it exceeds the temperature threshold, the threshold is decreased in order to lower the voice coil temperature. The compressor threshold may again be bounded by a lower and an upper limit.

FIG. 5 shows how the compression threshold is decreased over time to keep the temperature sufficiently low.

The invention provides a circuit and method to control the temperature of a loudspeaker voice coil by means of one or several parameters of a dynamic range compression module. The invention can be used in one or several (possibly multi-band) dynamic range compression modules. A control module then computes the adaptation of one or several DRC parameters as a function of the (estimated or measured) voice coil temperature.

Combinations of the control schemes outlined above are also possible. The control schemes are only examples and more complex schemes are possible. The basic concept underlying the invention is to adapt the DRC parameter(s) in dependence on temperature.

The dynamic range compressor can combine two functions, explained below.

"Compression" relates to limiting the dynamic range using a variable gain (this can be a slow effect), which can be considered as analogous to an automatic volume control.

"Limiting" the dynamic range relates to instantaneous (or very fast) limiting of the amplitude, e.g. by hard or soft clipping.

The difference between a compressor and a limiter is somewhat vague, but relates to how quick and how severe the effect is.

The DRC thus can comprise a variable gain element (possibly preceded by a linear filter), followed by a fast or instantaneous limiter (such as a sigmoid function or hard limiter) for limiting of the signal amplitude. The limiter implements a non-linear operation in the time domain (such as clipping).

The term dynamic range compressor is generally used to refer to any module that changes the crest factor of a signal, i.e. the peak-to-mean amplitude ratio. The characteristics of the DRC are adaptive as explained above.

The voice coil temperature estimation can be performed using well known techniques as outlined above, for example based on calculations derived from the voice coil current and voltage, which can both be measured using a resistance in series with the voice coil.

The voice coil temperature can be based on a loudspeaker impedance at a single evaluation frequency, which may be selected as one which does not produce a large signal output, for example lower than 100 Hz.

The system further comprises a digital to analogue converter, which is not shown in FIG. 1, as part of the loudspeaker drive system. The main processing can be implemented on a DSP or micro-controller.

The source signal at the input to the DRC module 10 can be retrieved from a memory, or can be input to the DSP or microcontroller via an analogue-to-digital converter (ADC).

The invention can be part of a software module to protect a loudspeaker, more specifically to provide a thermal protection of a loudspeaker. A computer program embodying the invention may be stored/distributed on a suitable medium, such as an optical storage medium or a solid-state medium supplied together with or as part of other hardware, but may also be distributed in other forms, such as via the Internet or other wired or wireless telecommunication systems.

The invention can be implemented on a platform where the temperature of the voice coil can be measured or estimated. The term "estimation" as used herein includes the possibility of simply measuring temperature using a temperature sensor, since this will still constitute an estimation given the inaccuracies involved, for example resulting from thermal coupling between the voice coil and the temperature sensor.

Figure 6:
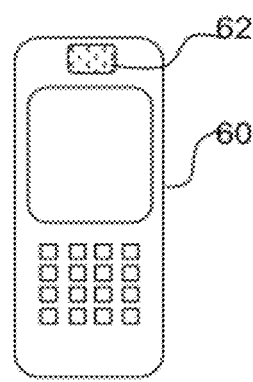
FIG. 6 shows a mobile telephone in which the loudspeaker system can be implemented.

FIG. 6 shows a mobile phone 60 including the loudspeaker system 62 of the invention.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. A loudspeaker drive circuit comprising:
 a dynamic range compressor for implementing a non-linear gain function between an input signal to the dynamic range compressor and an output signal from the dynamic range compressor, the dynamic range compressor function having variable operating parameters to determine the non-linear gain function with a first gain portion below an input threshold level and a second gain portion above the input threshold level such that a slope of the second gain portion is smaller than a slope of the first gain portion;

a loudspeaker driver for driving a loudspeaker based on the output of the dynamic range compressor; and a control unit for controlling the variable operating parameters of the dynamic range compressor in dependence on a control signal which represents the estimated voice coil temperature and the input signal, and in a way which influences voice coil temperature, wherein a change in the estimated voice coil temperature changes the non-linear gain function;

wherein the input threshold level is a variable that is lowered over time.

2. A circuit as claimed in claim 1, further comprising a temperature estimation unit for estimating a voice coil temperature of the loudspeaker as the control signal.

3. A circuit as claimed in claim 1, wherein the operating parameter of the dynamic range compressor which is controlled is the input threshold level.

4. A circuit as claimed in claim 2, wherein the threshold level is decreased in response to an increase in estimated temperature.

5. A circuit as claimed in claim 1, wherein the dynamic range compressor functions as a limiter, with the output substantially constant when the input is above the threshold.

6. A circuit as claimed in claim 3, wherein the operating parameter of the dynamic range compressor which is controlled is a slope of the first or second gain portion.

7. A circuit as claimed in claim 2, wherein a slope of the first or second gain portion is decreased in response to an increase in estimated temperature.

8. A loudspeaker system comprising a circuit as claimed in claim 1, and a loudspeaker.

9. A portable device comprising a loudspeaker system as claimed in claim 8.

10. A method of processing an audio input signal to generate a loudspeaker drive signal, comprising:

using a dynamic range compressor to implement a non-linear gain function between an input signal to the dynamic range compressor and an output signal from the dynamic range compressor, the dynamic range compressor function having variable operating parameters to determine the non-linear gain function with a first gain portion below an input threshold level and a second gain portion above the input threshold level such that a slope of the second gain portion is smaller than a slope of the first gain portion;

driving a loudspeaker based on the output of the dynamic range compressor;

controlling the variable operating parameters of the dynamic range compressor in dependence on a control signal that represents an estimated voice coil temperature and the input signal and in a way which influences voice coil temperature, and wherein the controlling comprises:

decreasing the threshold level in response to an increase in the estimated voice coil temperature, or decreasing a slope of the first or second gain portion in response to an increase in the estimated voice coil temperature.

11. A method as claimed in claim 10, further comprising estimating a voice coil temperature of the loudspeaker and deriving the control signal from the estimate.

12. A computer program on a non-transitory computer-readable storage medium for implementing a method as claimed in claim 10 when said program is run on a computer.

13. The loudspeaker drive circuit of claim 1, wherein the high amplitude or high-power input signals comprise input signals that are higher than 40% of an input signal limit either measured in amplitude or in power.

14. The loudspeaker drive circuit of claim 1, wherein the control unit is configured to gradually change a slope of the first and second gain portion.

* * * * *